(12) United States Patent
Hudson et al.

(10) Patent No.: US 6,255,221 B1
(45) Date of Patent: Jul. 3, 2001

(54) METHODS FOR RUNNING A HIGH DENSITY PLASMA ETCHER TO ACHIEVE REDUCED TRANSISTOR DEVICE DAMAGE

(75) Inventors: Eric A. Hudson, Berkeley; Jaroslaw W. Winniczek, Daly City; Joel M. Cook, Pleasanton, all of CA (US); Helen L. Maynard, Somerset, NJ (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/215,020

(22) Filed: Dec. 17, 1998

(51) Int. Cl.[7] .................................................... H01L 21/02
(52) U.S. Cl. .................... 438/710; 438/714; 438/722; 438/725; 438/910; 216/67; 216/68; 216/71; 216/76; 216/80
(58) Field of Search .................................. 438/710, 714, 438/722–725, 910; 216/67, 68, 71, 76, 80

(56) References Cited

U.S. PATENT DOCUMENTS 5,779,925 * 7/1998 Hashimoto et al. ................ 216/67
5,846,885 * 12/1998 Kamata et al. ..................... 438/729
6,093,332 * 7/2000 Winniczek et al. ................. 216/2

* cited by examiner

*Primary Examiner*—Robert Kunemund
(74) *Attorney, Agent, or Firm*—Oppenheimer Wolff & Donnelly LLP

(57) ABSTRACT

Disclosed are methods and systems for etching dielectric layers in a high density plasma etcher. A method includes providing a wafer having a photoresist mask over a dielectric layer in order to define at least one contact via hole or open area that is electrically interconnected down to the silicon substrate of the wafer. The method then proceeds to inserting the wafer into the high density plasma etcher and pulsed application a TCP power source of the high density plasma etcher. The pulsed application includes ascertaining a desired etch performance characteristic, which includes photoresist selectivity and etch rate which is associated with a continuous wave application of the TCP source. Then, selecting a duty cycle of the pulsed application of the TCP source and scaling a peak power of the pulsed application of the TCP source in order to match a cycle-averaged power that would be delivered by the continuous wave application of the TCP source. The pulsed application of the TCP power source is configured to etch through the dielectric layer to at least one contact via hole or open area while substantially reducing damage to the transistor gate oxides of the transistor devices.

29 Claims, 4 Drawing Sheets

METHODS FOR RUNNING A HIGH DENSITY PLASMA ETCHER TO ACHIEVE REDUCED TRANSISTOR DEVICE DAMAGE

BACKGROUND OF THE INVENTION

1. Field of the Invention

The present invention relates to the fabrication of semiconductor integrated circuits (IC's). More particularly, the present invention relates to improved methods and systems for etching dielectric layers of semiconductor devices with reduced damage to transistor device gate oxides.

2. Description of the Related Art

In semiconductor IC fabrication, devices such as component transistors are formed on a semiconductor wafer substrate, which is typically made of silicon. During the fabrication process, various materials are deposited on different layers in order to build a desired IC. Typically, conductive layers, which may include patterned metallization lines, polysilicon transistor gates and the like, are insulated from one another by dielectric material layers. Such dielectric layers typically include thermally grown silicon dioxide ($SiO_2$), tetra-ethyl-ortho-silicate (TEOS), phosphosilicate glass (PSG), borophosphosilicate glass (BPSG), USG (undoped spin-on-glass), LTO, etc. Because semiconductor ICs are fabricated as multi-layered structures, there is a common need to interconnect IC features that are patterned on one layer to IC features of other layers. To accomplish these interconnections, via holes are typically etched through the dielectric materials down to underlying features.

Once the via holes are etched, the via holes are filled with a conductive material (e.g., tungsten, aluminum, etc.) to establish conductive vias between features of the underlayer and a subsequently deposited and patterned metallization layer. In other cases, via holes are etched down to an underlying polysilicon transistor gate or silicon wafer diffusion region. Once these vias are etched, the via holes are conductively filled to form electrical "contacts" between the underlying devices and a subsequently deposited and patterned metallization layer.

FIG. 1 is a cross-sectional view of a partially fabricated semiconductor device 100. As shown, a semiconductor substrate 102 has exemplary diffusion regions 104, a gate oxide 110, and a polysilicon gate 112, which define a transistor device. As mentioned above, a dielectric material 106 is commonly formed over the transistor devices to insulate them from subsequently deposited and patterned metallization lines (not shown). As device features continue to be designed smaller and smaller, vias etched through the dielectric material 106 will have higher aspect ratios (i.e., deeper and narrower vias). To facilitate etching of these high aspect ratio via holes, fabrication engineers have been more frequently implementing high density plasma etchers. High density plasma etchers are also now preferred over capacitively coupled source etchers due to their unique ability to provide substantially improved etch rates.

Although high density etchers have these benefits, they also have the downside of introducing a substantial amount of charge into the substrate when contact via holes are etched down to diffusion regions 104. As is well known, the plasma etch 114 operation is typically performed after a photoresist layer 108 is spin-coated over the surface of the dielectric layer 106 and then patterned using conventional photolithography techniques. In the example of FIG. 1, upon breaking through the dielectric layer 106 to a diffusion region 104, a potential difference will typically develop between the top surface of the polysilicon gate 112 (P1) and the top surface of the diffusion region 104 (P2).

FIG. 1 also shows an open area 116, which arises due to a relatively large opening in the photoresist mask 108. The open area 116 may represent the wafer edge region, in the case that photoresist edge bead removal has been employed prior to etching. The open area 116 may also represent scribe lines, or any other opening which has a width substantially greater than the dielectric film thickness. Upon breaking through the dielectric layer 106 to the open area 116, a potential difference will typically develop between the top surface of the polysilicon gate 112 (P1) and the open area 116 (P3).

A potential difference across the gate oxide 110 may also be induced in the case which is similar to that of FIG. 1, but where the contact via to the polysilicon gate 112 has already been etched and subsequently filled with a conductive material such as tungsten. In this case, the potential of the photoresist layer 108 (P4) will be roughly equal to the potential at the top surface of the polysilicon gate 112 (P1), and will differ from the potential of the top surface of the diffusion region 104 (P2) or at the top surface of the open area 116 (P3).

Due to the different geometries of the etched features, the charged particles impacting the wafer films and wafer substrate from the plasma may induce potential differences. The continuing flux of charged particles allows a substantial current "I" to develop across the potential gradients. This current I is unfortunately much greater than the level of current the gate oxide 110 was designed to handle. As a result of the plasma-induced current through the gate structure, fabrication and reliability engineers have observed a great deal of damage to the gate oxides 110 throughout transistor devices of a silicon wafer. In many cases, the potential difference across the gate oxides 110 will be so large that the oxide material will degrade to the point where the particular transistor devices will no longer work in their intended mode of operation. In other cases, the damage to the gate oxides 110 will be such that the transistor devices will fail to meet specific reliability and operational requirements.

In view of the foregoing, what is needed are methods and systems for etching vias that make electrical contact with the silicon substrate using high density plasma etchers, while reducing damage to sensitive gate oxides of transistor devices throughout the silicon substrate.

SUMMARY OF THE INVENTION

The present invention fills these needs by providing methods and systems for reducing gate oxide damage during dielectric etch operations in high density plasma etchers. It should be appreciated that the present invention can be implemented in numerous ways, including as a process, an apparatus, a system, a device, and a method. Several inventive embodiments of the present invention are described below.

In one embodiment, a method for etching dielectric layers in a high density plasma etcher is disclosed. The method includes providing a wafer having a dielectric layer disposed over transistor devices. The transistor devices include transistor gate oxides and gate electrodes, and diffusion regions. The method then includes forming a photoresist mask over the dielectric layer in order to define at least one contact via hole over one of the diffusion regions, and inserting the wafer into the high density plasma etcher. Then, the method moves to setting up chemistry conditions, temperature conditions and pressure conditions within the high density plasma etcher. Once the conditions are proper, the method moves to pulsed application of a Transformer-Coupled Plasma (TCP) RF power source of the high density plasma etcher and applying RF bias power to a bottom electrode of the high density plasma etcher. The pulsed application of the TCP source is configured to etch through the dielectric layer to define the at least one contact via hole over a diffusion region while substantially reducing damage to the transistor gate oxides of the transistor devices.

In another embodiment, a method for etching dielectric layers in a high density plasma etcher is disclosed. The method includes providing a wafer having a photoresist mask over a dielectric layer in order to define at least one contact via hole over at least one transistor diffusion region. The method then proceeds to insertion of the wafer into the high density plasma etcher and pulsed application of a TCP source of the high density plasma etcher. The pulsed application includes ascertaining a desired etch performance characteristic, which includes photoresist oxide selectivity and oxide etch rate, which is associated with a continuous wave application of the TCP source. Then, selecting a duty cycle of the pulsed application of the TCP source and scaling a peak power of the pulsed application of the TCP source in order to match a cycle-averaged power that would be delivered by the continuous wave application of the TCP source. The pulsed application of the TCP source is configured to etch through the dielectric layer down to the at least one transistor diffusion region while substantially reducing damage to the transistor gate oxides of the transistor devices.

In yet another embodiment, a high density etching system for etching layers of a semiconductor wafer is disclosed. The system includes a chamber that has a TCP source and a bias source. The bias source has a surface for supporting the semiconductor wafer. The system further includes RF generators for applying power to the TCP source and the bias source. The TCP RF generator is configured to pulse the power applied through the TCP source of the chamber.

In still another embodiment, a method for etching dielectric layers of any level of an integrated circuit device, in a high density plasma etcher, is disclosed. This method includes providing a wafer having a photoresist mask over a dielectric layer in order to define at least one via hole that is electrically interconnected down to a silicon substrate of the wafer. Thus, the dielectric layer can be the insulative layer of any level of the wafer being processed. The wafer is then inserted into the high density plasma etcher. Once inserted, the method proceeds to pulse applying a TCP source of the high density plasma etcher. The pulsed application includes: (a) ascertaining a desired etch performance characteristic, including photoresist selectivity and etch rate which is associated with a continuous wave application of the TCP source; (b) selecting a duty cycle of the pulsed application of the TCP source; and (c) scaling a peak power of the pulsed application of the TCP source in order to match a cycle-averaged power that would be delivered by the continuous wave application of the TCP source. The pulsed application of the TCP source, in this embodiment, is configured to etch the via hole through the dielectric layer while substantially reducing damage to transistor gate oxides of transistor devices formed over the wafer.

By pulsing the application of the TCP source, it is believed that the time-averaged electron temperature during etching is lowered due to the off-time ($T_{OFF}$) of the pulse period T. This reduced mean electron temperature (and reduced average sheath potential) therefore reduces the plasma induced potentials within features being etched (e.g., contact vias etched into the dielectric layer down to the silicon diffusion regions of a semiconductor wafer). The reduced potentials result in reduced plasma-induced current, and therefore assist in reducing damage to transistor gate oxides, which is a common problem during contact via hole etching operations that are performed through dielectric materials in high density etchers. These and other advantages of the present invention will become apparent upon reading the following detailed descriptions and studying the various figures of the drawings.

BRIEF DESCRIPTION OF THE DRAWINGS

The invention, together with further advantages thereof, may best be understood by reference to the following description taken in conjunction with the accompanying drawings.

DETAILED DESCRIPTION OF THE PREFERRED EMBODIMENTS

An invention is described for reducing gate oxide damage during dielectric etch operations in high density plasma etchers. In the following description, numerous specific details are set forth in order to provide a thorough understanding of the present invention. It will be obvious, however, to one skilled in the art, that the present invention may be practiced without some or all of these specific details. In other instances, well known process steps have not been described in detail in order not to unnecessarily obscure the present invention.

Figure 2A:
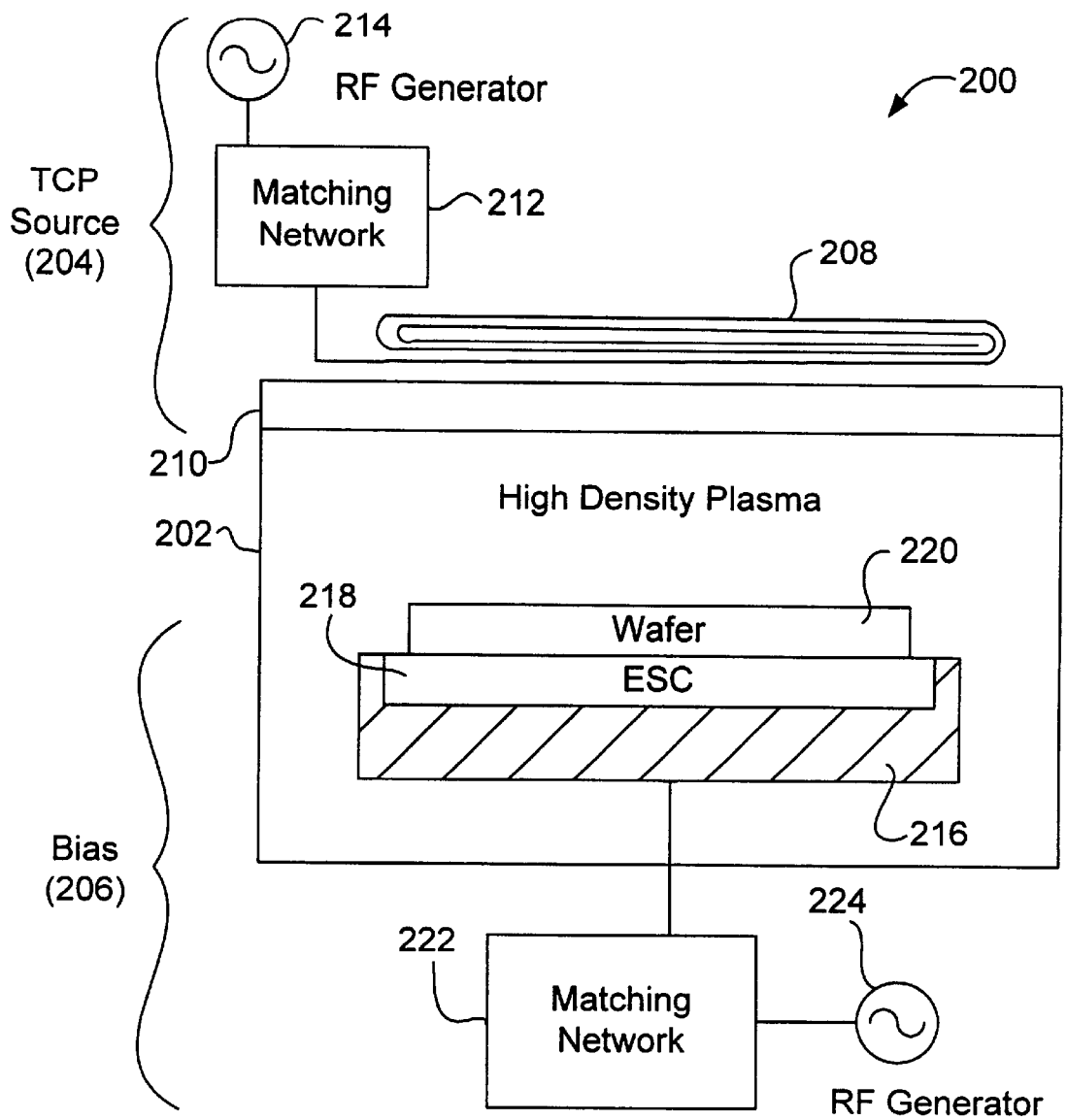
FIG. 2A illustrates a simplified diagram of a high density plasma etcher, including an inductively coupled plasma source, in accordance with one embodiment of the present invention.

FIG. 2A illustrates a simplified diagram of a high density plasma etcher 200, including an inductively coupled plasma source, in accordance with one embodiment of the present invention. By way of example, the high density plasma etcher 200 may be a TCP™ 9100 etch system, which is available from Lam Research Corporation of Fremont, Calif. This exemplary diagram illustrates a chamber 202 which is powered by a TCP (transformer coupled plasma) source 202 and a RF bias 206. The TCP source 202 includes an RF generator 214 that couples to a matching network 212 and then to an RF coil 208. The RF coil 208 is coupled to a dielectric RF window 210 that is coupled to a top portion of the chamber 202. The RF bias 206 includes an RF generator 224 that is coupled to a matching network 222. Generally, the RF bias 206 is implemented to create a DC bias, which assists in directing charged plasma particles toward the wafer 220. The matching network 222 is thus coupled to a bottom electrode 216, which typically includes an electrostatic chuck (ESC) 218 for securing the wafer 220 within the chamber 202. Of course, other types of techniques for securing the wafer 220, such as mechanical clamps may also be used.

Figure 2B:
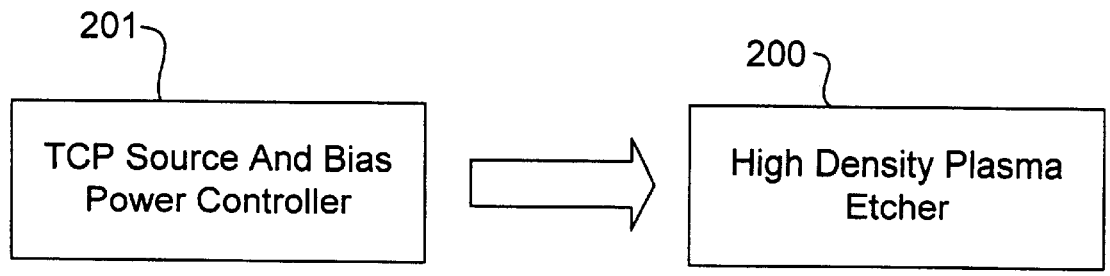
FIG. 2B illustrates a high level diagram of a TCP source and bias power controller that is configured to communicate with the high density plasma etcher of FIG. 2A, in accordance with one embodiment of the present invention.

FIG. 2B illustrates a high level diagram of a TCP source and bias power controller 201 that is configured to communicate with the high density plasma etcher 200, in accordance with one embodiment of the present invention. In general, the controller 201 may be coupled to or may be part of a computer station that is designed to communicate etch controlling parameters to the etcher 200. Typically, the computer station is used as an interface to enable process engineers to communicate and set temperature parameters, introduce well known etching chemistries at desired flow rates, establish pressures within the chamber, adjust or modify the power levels applied via the TCP source and bias of FIG. 2A, and control other process parameters.

In conventionally operated high density plasma etchers 200, the TCP generator 204 applies a constant amount of continuous power (i.e., via a continuous wave "CW") during the entire time a discrete step of the dielectric etching operation is performed. In one embodiment of the present invention, the TCP generator 204 is controlled such that a type of periodic power pulsing is applied during dielectric etching operations, especially when performing contact etch operations down to a silicon substrate. In this embodiment, the pulsed application of power is configured such that the ON time is not necessarily equal to the OFF time.

Figure 3:
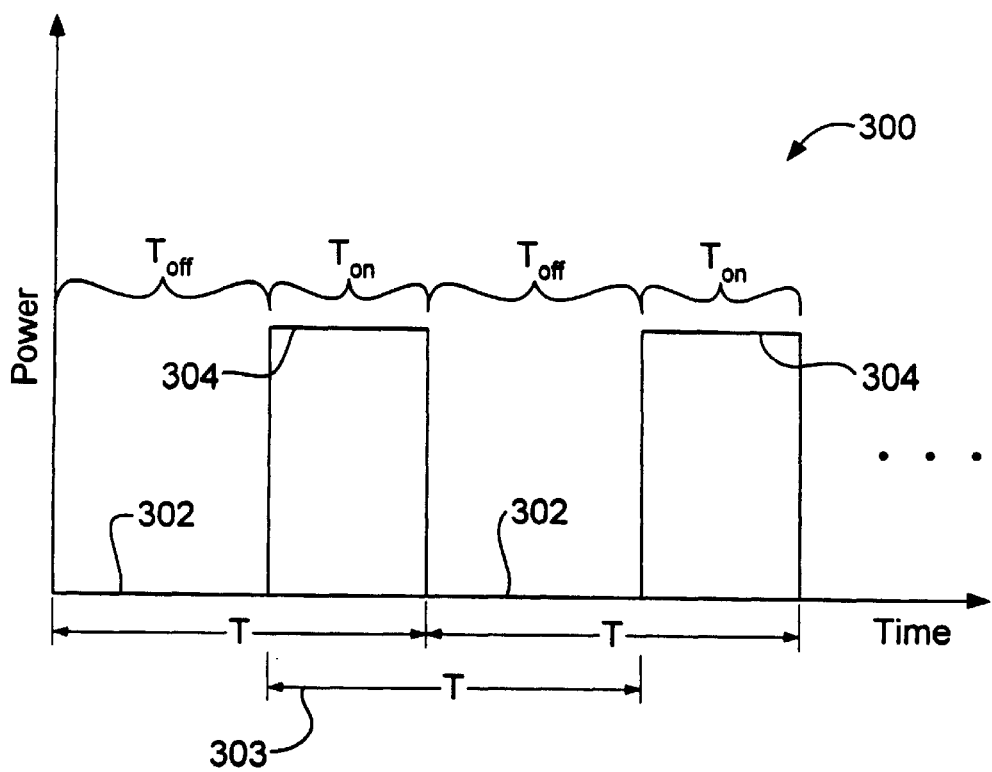
FIG. 3 illustrates an idealized plot of time verses power of the applied TCP power source, in accordance with one embodiment of the present invention.

Reference is now drawn to FIG. 3, where an idealized plot 300 of power verses time is shown in accordance with one embodiment of the present invention. In this illustration, the power axis is a representation (which can also be referred to as the power set point of the generator) of the pulsed application of power for the CP source 204. The pulsed application of power can be defined over any given period "T," in which over part of the period T the TCP power is off "$T_{OFF}$" 302 and the remaining part of the period T the TCP power is on "$T_{ON}$" 304. The duty cycle, in this embodiment, is defined by $T_{ON}/T$. In a most preferred embodiment of the present invention, the TCP source 204 is set to operate at a frequency ranging from about 200 KHz to about 40 MHz, and more preferably, between about 2 MHz and about 15 MHz, and most preferably, is set to operate at a frequency of about 13.56 MHz. The bias RF is preferably set to operate at a frequency ranging from about 200 KHz to about 30 MHz, and more preferably between about 400 KHz and about 13.56 MHz, and is most preferably set to operate at a frequency of about 4 MHz.

When the above described operating frequencies are implemented in the high density plasma etcher 200, the period T is preferably set to a value ranging between about 2 microseconds and about 2 milliseconds. Most preferably, the period T can range between about 10 microseconds and about 200 microseconds. In accordance with the preferred period T ranges, the preferred range for the duty cycle will be between about 10% and about 80%. The lower side of this preferred range is defined in order to ensure that the plasma will not become extinguished because the off-time $T_{OFF}$ is too long. Aside from this limitation, the duty cycle can be less than 10% so long as the $T_{ON}$ is longer than several cycles of the RF source 214. On the upper limit, the goal is such that the $T_{ON}$ does not approach being a non-pulsed continuous wave (CW). In addition, as the duty cycle is decreased, it will generally be more difficult to shift from a state in which the TCP power is substantially off to a state in which the TCP power is at a substantially full level.

Figure 4:
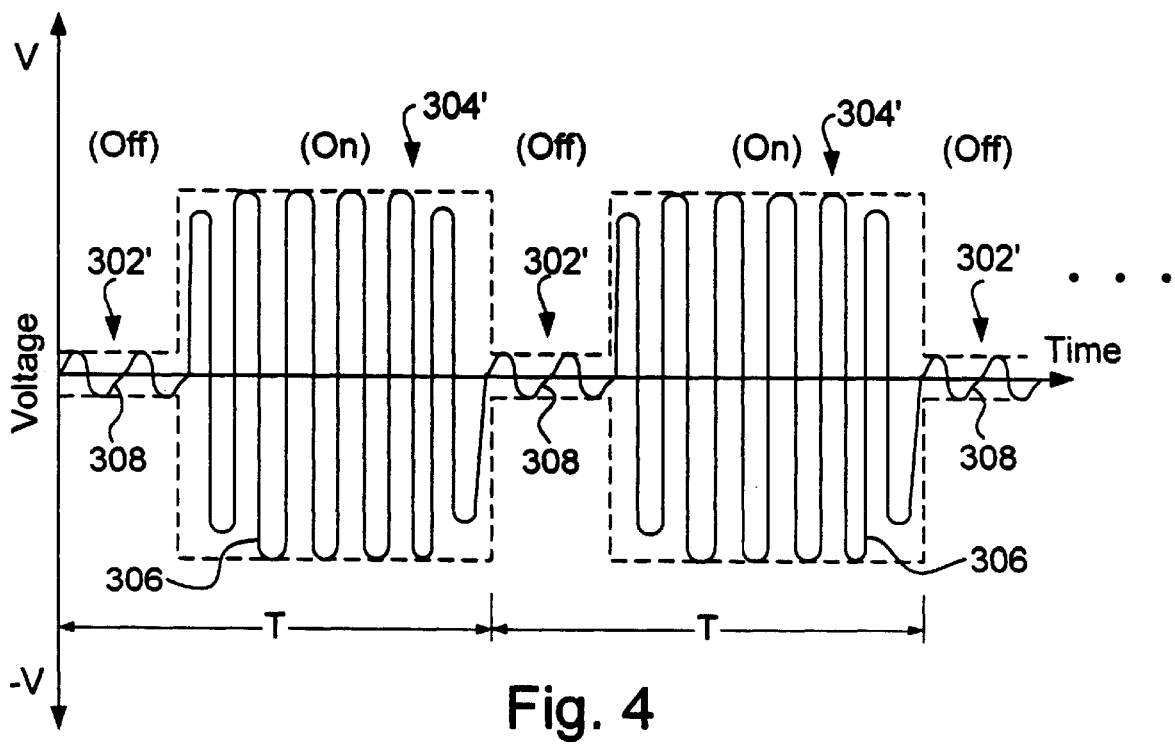
FIG. 4 illustrates an idealized representation of the RF voltage which is applied via a TCP RF generator, in accordance with one embodiment of the present invention.

FIG. 4 illustrates an idealized representation of the output of the RF generator 214 which is applied through the TCP source 204, in accordance with one embodiment of the present invention. In this plot, positive and negative voltage swings (i.e., +V/−V) are represented over time periods T. The RF generator 214 is generally configured to produce sinusoidal voltage swings at the desired RF operating frequency, and its output will ramp up from a substantially off power state 302' to a state in which the power is at a peak power state 304'. In the off power state 302', the sine wave 308 will correspond to a very low peak power that approaches about zero, while at 306, the sine wave will correspond to a power that approaches the peak power after an initial ramp up time. Therefore, in this preferred embodiment, the peak power level applied by the RF generator 214 is varied such that the cycle-averaged power delivered to the plasma is kept constant. As a result, the power level will be higher during the on-time $T_{ON}$, as compared to the power level delivered by a non-pulsed continuous wave (CW) case.

Figure 1:
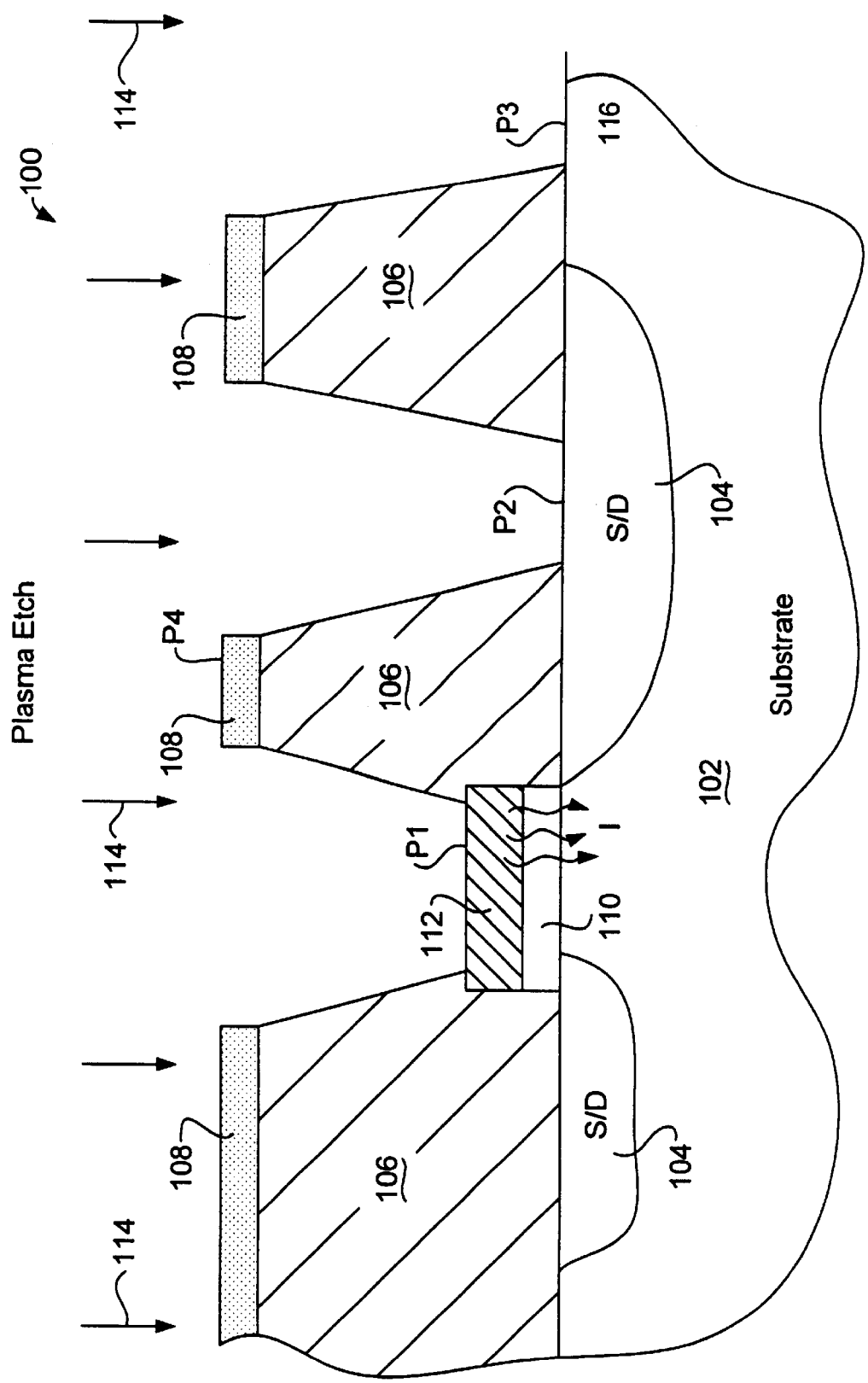
FIG. 1 is a cross-sectional view of a partially fabricated semiconductor device.

While not being bound by theory, the following model is presented to explain the mechanisms which are likely in the embodiments of the present invention. Accordingly, during the off-time $T_{OFF}$ of the pulse cycle, the high energy electrons rapidly leave the plasma. Therefore the electron temperature is much lower during the off-time $T_{OFF}$ than the on-time $T_{ON}$. At a lower electron temperature, the induced potential differences (e.g., P1 and P2 of FIG. 1) at etched feature profiles at the substrate will be reduced, which results in a lower time-averaged differential charging of the silicon substrate. The reduction in differential charging will therefore decrease the cumulative current through the device gates and thus diminishes the extent of the plasma charging effects that cause transistor gate oxide damaging currents. More specifically, the pulsed power application technique will have the benefit of reducing the average electron temperature, which means that the average plasma sheath potential will also be reduced. As a result, the lower potentials reduce the total amount of current that can be drawn through the gate oxides of the transistor devices that are fabricated throughout a silicon wafer, thereby reducing damage.

In other words, during the off-time $T_{OFF}$, the amount of high energy electrons in the plasma is reduced, which reduces the average energy of the electrons in the plasma. Reducing the amount of high energy electrons will not, however, reduce the effectiveness of the etching process. This is because the remaining ions and neutrals are primarily responsible for driving the etching process. Accordingly, the efficient etch process of high density plasma etchers will still be in effect, however, the high energy electrons that are believed to indirectly induce much of the gate oxide damage will be substantially diminished.

In experimental results, an etching process was run in both the pulsed power application method of the present invention and the continuous wave (CW) case. In this experiment, contact vias measuring about 0.35 microns were etched in a TEOS oxide film. Because conventional high density etchers running a continuous wave (CW) are known for their ability to deliver good combinations of photoresist-to-oxide selectivity and oxide etch rate, it is a goal of the present invention to provide a reduction in device damage without hampering etch performance. In one pulsed power application experimental test, the duty cycle was set to about 25%, and the off-time $T_{OFF}$ was set to about 100 microseconds, which defines a period T of about 133 microseconds. The resulting etch rate measured about 0.49 micron/minute, with a photoresist selectivity of about 1.94. In the CW case, the resulting etch rate measured about 0.51 micron/second, with a photoresist selectivity of about 1.72. These experimental results therefore illustrate that the pulsed TCP application will produce about the same beneficial etching results desired of high density etchers, albeit, with substantially reduced transistor device damage.

Figure 5:
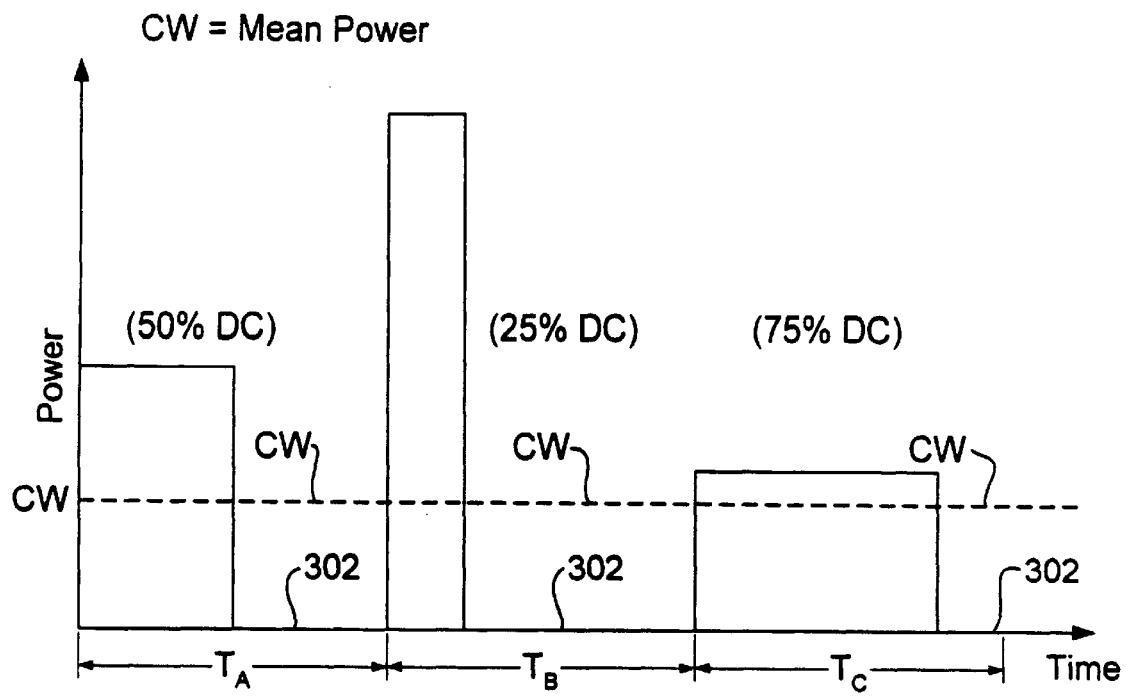
FIG. 5 pictorially illustrates how the cycle-averaged power delivered to the plasma is maintained substantially constant by varying the peak power of the on-time $T_{ON}$ relative to a continuous wave power level, in accordance with one embodiment of the present invention.

FIG. 5 pictorially illustrates how the cycle-averaged power delivered to the plasma is maintained substantially constant by varying the peak power of the on-time $T_{ON}$ 304 relative to the continuous wave power level. For instance, in the exemplary period $T_A$, the duty cycle (DC) is set to about 50%. In order to maintain the cycle-averaged power substantially constant, the peak power may be set to be about 2 times that of the CW case. In an exemplary period $T_B$, the duty cycle is set to about 25%, which necessitates the peak power to be about 4 times that of the CW case. Finally, in an example period $T_C$, the duty cycle is set to be about 75%, which necessitates the peak power to be about 1.33 times higher than the CW case.

In these representative examples, the CW power (i.e., mean TCP power) is preferably set to range between about 100 watts to about 6,000 watts, and more preferably between about 500 watts to about 2,500 watts. The peak TCP power can thus range between 100 watts and about 30,000 watts, and more preferably between about 500 watts and about 15,000 watts. In practice, the strategy of matching the pulsed power application by varying the peak power of the on-time $T_{ON}$ is followed in order to match an etch rate and photoresist selectivity known to be possible under a continuous wave (CW) etching operation.

Figure 6:
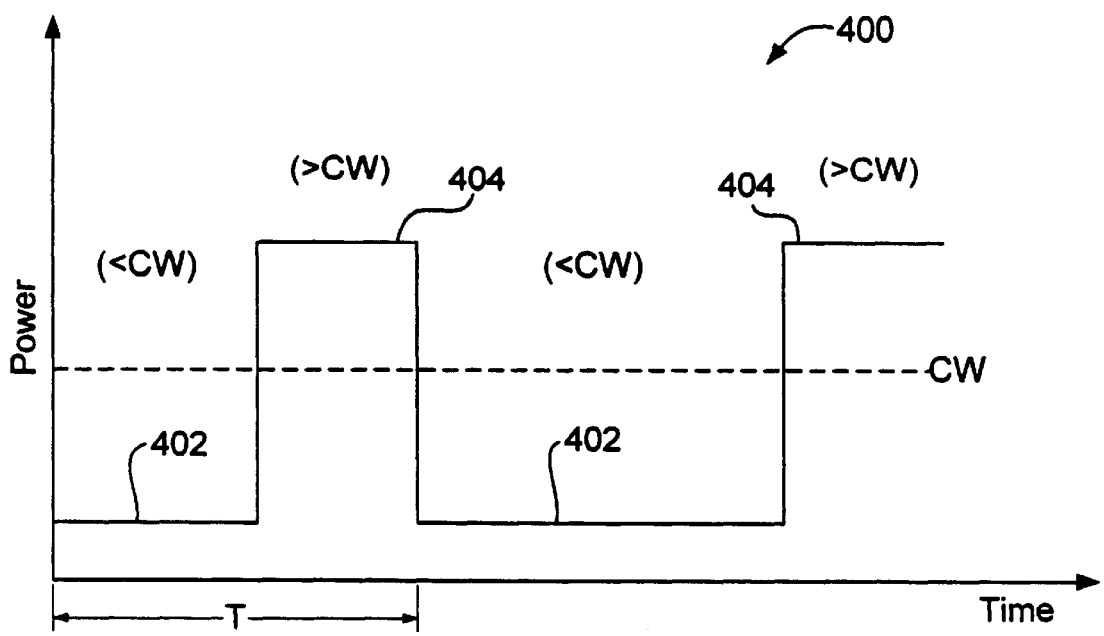
FIG. 6 illustrates an example in which the TCP power during $T_{OFF}$ is not completely off, but at a reduced power level relative to a continuous wave power level, in accordance with an alternative embodiment of the present invention.

FIG. 6 illustrates an example in which the power during $T_{OFF}$ is not completely off, but is instead at a reduced power level 402 (i.e., <CW). As in the above described embodiments, the high power level 404 is then set such that the cycle-averaged power delivered to the plasma is maintained substantially constant by varying the peak power relative to the continuous wave power level. It should therefore be understood that the pulsed TCP source embodiments of the present invention are only exemplary, and modifications in duty cycle, peak power application, as well as the power level of the off-time, may be varied without departing from the scope and spirit of this invention.

Once etching is complete, post-etch processing that is conventional in nature is commonly performed. Thereafter, the finished wafer may be cut into dies, which may then be made into IC chips. The resulting IC chips can then be incorporated in an electronic device, e.g., any of the well known commercial or consumer electronic devices, including digital computers. Furthermore, although the TCP™ 9100 has been described in detail herein, it should be borne in mind that the invention is not necessarily limited to any particular system and may in fact be implemented in other high density etchers that may be manufactured by companies other than Lam Research.

In additional embodiments of the invention, the wafer being etched may be farther along in the integrated-circuit processing procedure. Specifically, after the contact vias for transistor devices have been etched, and those vias filled with a conductive material, subsequent dielectric films are deposited, etched, and filled with conductive material to provide portions of the electrical connections between devices, bond pads, and other components of the circuit. During these interconnect via or damascene etch procedures, a potential difference may again be induced across the sensitive gate oxide of the transistor device. In particular, the potential at the bottom of a small feature such as a trench or via may be applied to the top of the gate through the existing conductor lines and vias, while a differing potential at the bottom of an open area may be applied through the silicon substrate to the bottom of the gate. In the case of these etch procedures, the pulsed application of TCP power is utilized to reduce the plasma-induced damage, in essentially the same manner as described above.

Those skilled in the art of semiconductor processing will recognize that the methods and systems of the present invention are suitable for use in etching all types of dielectric materials used in semiconductor manufacturing. For reference sake, several examples of commonly used dielectrics include oxides, low-k dielectrics, and high-k dielectrics among others. However, it is believed that the present invention is applicable and beneficial in the etching of all types of dielectrics.

While this invention has been described in terms of several preferred embodiments, there are alterations, permutations, and equivalents which fall within the scope of this invention. It should also be noted that there are may alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for etching dielectric layers in a high density plasma etcher, comprising:

providing a wafer having a dielectric layer disposed over transistor devices, the transistor devices including transistor gate oxides and gate electrodes, and diffusion regions;

forming a photoresist mask over the dielectric layer in order to define at least one contact via hole over one of the diffusion regions;

inserting the wafer into the high density plasma etcher;

ascertaining an etch performance characteristic, including photoresist selectivity and etch rate which is associated with a continuous wave application of the TCP source;

setting up gas flow conditions, temperature conditions and pressure conditions within the high density plasma etcher;

selecting a duty cycle of a pulse application of a TCP source of the high density plasma etcher;

pulse applying the TCP power source;

scaling a peak power of the pulse application of the TCP source in order to match a cycle-averaged power that would be delivered by the continuous wave application of the TCP source, wherein the scaling is designed to vary the peak power of the pulse application of the TCP source inversely to the duty cycle; and applying an RF bias to a bottom electrode of the high density plasma etcher;

wherein the pulse applying of the TCP power source is configured to etch through the dielectric layer to define the at least one contact via hole over one of the diffusion regions while substantially reducing damage to the transistor gate oxides of the transistor devices.

2. A method for etching dielectric layers in a high density plasma etcher as recited in claim 1, wherein the pulse applying of the TCP power source is defined over a period T.

3. A method for etching dielectric layers in a high density plasma etcher as recited in claim 2, wherein the period T has an on-time $T_{ON}$ and an off-time $T_{OFF}$, and the period T is equal to a sum of the on-time $T_{ON}$ plus the off-time $T_{OFF}$.

4. A method for etching dielectric layers in a high density plasma etcher as recited in claim 3, wherein the pulse of the TCP power source has a duty cycle defined by $T_{ON}/T$.

5. A method for etching dielectric layers in a high density plasma etcher as recited in claim 4, further comprising:

setting the duty cycle to be between about 10 percent and about 80 percent.

6. A method for etching dielectric layers in a high density plasma etcher as recited in claim 4, further comprising:

setting the period T to be between about 10 microseconds and about 2 milliseconds.

7. A method for etching dielectric layers in a high density plasma etcher as recited in claim 1, wherein the scaling is designed to increase the peak power of the pulse application of the TCP source when the duty cycle is decreased.

8. A method for etching dielectric layers in a high density plasma etcher as recited in claim 1, wherein the scaling is designed to decrease the peak power of the pulse application of the TCP source when the duty cycle is increased.

9. A method for etching dielectric layers in a high density plasma etcher as recited in claim 1, wherein the peak power can vary between about 100 watts and about 30,000 watts.

10. A method for etching dielectric layers in a high density plasma etcher recited in claim 3, wherein the TCP power during the off-time $T_{OFF}$ can range between being substantially off to being at a reduced power level that is less than a power level of a continuous wave power level.

11. A method for etching dielectric layers in a high density plasma etcher as recited in claim 1, wherein the high density etcher is a TCP etching system.

12. A method for etching dielectric layers in a high density plasma etcher, comprising:

providing a wafer having a photoresist mask over a dielectric layer in order to define at least one contact via hole over at least one transistor diffusion region;

inserting the wafer into the high density plasma etcher;

pulse applying a TCP source of the high density plasma etcher, wherein the pulse applying includes, ascertaining an etch performance characteristic, including photoresist selectivity and etch rate which is associated with a continuous wave application of the TCP source;

selecting a duty cycle of the pulsed application of the TCP source; and scaling a peak power of the pulsed application of the TCP source in order to match a cycle-averaged power that would be delivered by the continuous wave application of the TCP source, wherein the scaling is designed to vary the peak power of the pulse application of the TCP source inversely to the duty cycle;

wherein the pulsed application of the TCP source is configured to etch through the dielectric layer down to the at least one transistor diffusion region while substantially reducing damage to transistor gate oxides of transistor devices that are defined on the wafer.

13. A method for etching dielectric layers in a high density plasma etcher as recited in claim 12, wherein the pulsed application of the TCP source is defined over a period T.

14. A method for etching dielectric layers in a high density plasma etcher as recited in claim 13, wherein the period T has an on-time $T_{ON}$ and an off-time $T_{OFF}$, and the period T is equal to a sum of the on-time $T_{ON}$ plus the off-time $T_{OFF}$.

15. A method for etching dielectric layers in a high density plasma etcher as recited in claim 14, wherein the duty cycle of the pulse of the TCP source is defined by $T_{ON}/T$.

16. A method for etching dielectric layers in a high density plasma etcher as recited in claim 14, further comprising:

setting the duty cycle to be between about 10 percent and about 80 percent.

17. A method for etching dielectric layers in a high density plasma etcher as recited in claim 16, further comprising:

setting the period T to be between about 10 microseconds and about 2 milliseconds.

18. A method for etching dielectric layers in a high density plasma etcher as recited in claim 12, wherein the peak power can vary between about 100 watts and about 30,000 watts.

19. A method for etching dielectric layers in a high density plasma etcher as recited in claim 14, wherein the TCP power during the off-time $T_{OFF}$ can range between being substantially off to being at a reduced power level that is less than a power level of a continuous wave power level.

20. A method for etching dielectric layers in a high density plasma etcher as recited in claim 12, wherein the high density etcher is a TCP etching system.

21. A method for etching dielectric layers in a high density plasma etcher, comprising:

providing a wafer having a photoresist mask over a dielectric layer in order to define at least one via hole or open area that is electrically interconnected down to a silicon substrate of the wafer, the dielectric layer being any layer of wafer;

inserting the wafer into the high density plasma etcher;

pulse applying a TCP source of the high density plasma etcher, wherein the pulse applying includes, ascertaining an etch performance characteristic, including photoresist selectivity and etch rate which is associated with a continuous wave application of the TCP source;

selecting a duty cycle of the pulsed application of the TCP source; and scaling a peak power of the pulsed application of the TCP source in order to match a cycle-averaged power that would be delivered by the continuous wave application of the TCP sources, wherein the scaling is designed to vary the peak power of the pulse application of the TCP source inversely to the duty cycle;

wherein the pulsed application of the TCP source is configured to etch the via hole through the dielectric layer while substantially reducing damage to transistor gate oxides of transistor devices formed over the wafer.

22. A method for etching dielectric layers in a high density plasma etcher as recited in claim 21, wherein the pulsed application of the TCP source is defined over a period T.

23. A method for etching dielectric layers in a high density plasma etcher as recited in claim 22, wherein the period T has an on-time $T_{ON}$ and an off-time $T_{OFF}$, and the period T is equal to a sum of the on-time $T_{ON}$ plus the off-time $T_{OFF}$.

24. A method for etching dielectric layers in a high density plasma etcher as recited in claim 23, wherein the duty cycle of the pulse of the TCP source is defined by $T_{ON}/T$.

25. A method for etching dielectric layers in a high density plasma etcher as recited in claim 23, further comprising:

setting the duty cycle to be between about 10 percent and about 80 percent.

26. A method for etching dielectric layers in a high density plasma etcher as recited in claim 25, further comprising:

setting the period T to be between about 10 microseconds and about 2 milliseconds.

27. A method for etching dielectric layers in a high density plasma etcher as recited in claim 21, wherein the peak power can vary between about 100 watts and about 30,000 watts.

28. A method for etching dielectric layers in a high density plasma etcher as recited in claim 23, wherein the TCP power during the off-time $T_{OFF}$ can range between being substantially off to being at a reduced power level that is less than a power level of a continuous wave power level.

29. A method for etching dielectric layers in a high density plasma etcher as recited in claim 21, wherein the high density etcher is a TCP etching system.

* * * * *